United States Patent
Bemat et al.

(10) Patent No.: US 11,251,607 B2
(45) Date of Patent: Feb. 15, 2022

(54) FUSE HAVING PARALLEL TRANSORB DEVICE WITH SWITCH

(71) Applicant: HEWLETT PACKARD ENTERPRISE DEVELOPMENT LP, Houston, TX (US)

(72) Inventors: Mohamed Amin Bemat, Cypress, TX (US); Daniel Humphrey, Tomball, TX (US); Benjamin Wade Dumas, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 199 days.

(21) Appl. No.: 16/212,594

(22) Filed: Dec. 6, 2018

(65) Prior Publication Data

US 2020/0185911 A1 Jun. 11, 2020

(51) Int. Cl.
*H02H 9/02* (2006.01)
*H03K 17/082* (2006.01)

(52) U.S. Cl.
CPC ......... *H02H 9/025* (2013.01); *H03K 17/0822* (2013.01)

(58) Field of Classification Search
CPC ..... H02H 9/025; H02H 9/004; H03K 17/0822
USPC .......................................................... 361/63
See application file for complete search history.

(56) References Cited

U.S. PATENT DOCUMENTS

| | | | | |
|---|---|---|---|---|
| 5,910,690 A | * | 6/1999 | Dorsey | H02H 9/004 307/141 |
| 6,301,133 B1 | * | 10/2001 | Cuadra | H02J 1/102 363/65 |
| 8,164,876 B2 | | 4/2012 | Simi | |
| 8,456,138 B2 | * | 6/2013 | Lei | H05B 41/28 322/24 |
| 2002/0176216 A1 | * | 11/2002 | Del Signore II | H02H 9/001 361/93.9 |
| 2005/0189965 A1 | * | 9/2005 | Tihanyi | H03K 17/302 327/108 |
| 2006/0007620 A1 | * | 1/2006 | Ochi | H02H 9/004 361/93.1 |
| 2010/0164459 A1 | * | 7/2010 | Perichon | H01L 31/02021 323/284 |

(Continued)

FOREIGN PATENT DOCUMENTS

| | | |
|---|---|---|
| CN | 202602269 U | 12/2012 |
| CN | 204068238 U | 12/2014 |
| CN | 207234381 U | 4/2018 |

*Primary Examiner* — Kevin J Comber
(74) *Attorney, Agent, or Firm* — McDermott Will & Emery (57) ABSTRACT

An electronic fuse (e-fuse) for controlling input current of a load includes a transistor switch and a transorb device that is coupled in parallel to the transistor switch between a source and a drain of the transistor switch. A circuit comprising the transistor switch and the transorb device in parallel comprises a first end and a second end. The first end of the circuit is coupled to a power bus. The second end of the circuit is coupled to a first node of the load. The e-fuse includes an RC circuit comprising a resistor coupled in series with a first capacitor. The RC circuit is coupled between the power bus at the first end of the circuit and a return. The return is coupled to a second node of the load. The e-fuse includes a second capacitor that is coupled between the return and the second end of the circuit.

20 Claims, 8 Drawing Sheets

(56) References Cited

U.S. PATENT DOCUMENTS

| | | | |
|---|---|---|---|
| 2013/0002045 A1* | 1/2013 | Hassan-Ali | H02M 3/07 |
| | | | 307/130 |
| 2013/0021700 A1 | 1/2013 | Greither | |
| 2016/0254741 A1* | 9/2016 | Andersson | G05F 1/573 |
| | | | 323/284 |
| 2017/0045929 A1* | 2/2017 | Grant | G06F 1/26 |
| 2018/0145674 A1* | 5/2018 | Bunin | H03K 17/0822 |
| 2018/0294646 A1* | 10/2018 | Simonson | H02H 9/025 |

* cited by examiner

FUSE HAVING PARALLEL TRANSORB DEVICE WITH SWITCH

BACKGROUND

A conventional server typically includes one or more power supplies that provide power through a power bus to a plurality of loads, e.g., devices. For example, the power supplies may provide power to motherboards and processors. When a new load is inserted, e.g., when a new motherboard is inserted, the server may not shut down and the new motherboard may be hot-plug inserted into the server. It is essential that the hot-plug insertion of the new load does not disturb normal operation of other loads of the server. Specifically, it is essential that the insertion of the new load does not exceed the power (voltage and/or current) ratings of the server's power bus. Thus, it may be required that any disturbance caused by the hot-plug insertion of the new load stay within acceptable power ratings of the server.

Furthermore, in situations where the new load is faulty (e.g., includes a short circuit), the insertion of the new load may create a fault condition and may draw considerable current from the power bus and the power supplies. The considerable current drawn from the power supplies may exceed the current and voltage ratings of the power bus of the server, may adversely affect a voltage stability of the power bus of the server, and may cause a shutdown of the server or some of the server loads.

In order to prevent the current drawn by a load from adversely affecting the voltage stability of the power bus, the loads of the server may be equipped with an electronic fuse. The electronic fuse of the load permits for disconnecting the load from the power bus and the power supplies when the load is faulty and draws a large amount of current. However, in these instances, suddenly disrupting the large amount of current drawn by the load may in turn induce an unwanted large inductive voltage spike on the power bus that can also affect the electronic fuse.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

In some embodiments, an exemplary fuse coupled to a load, e.g., a first load, is discussed. A power bus may be coupled via the fuse to the first load and other loads. The fuse may be coupled across the power bus that provides power to the first load. The fuse may be used for controlling a current of the first load and for controlling voltage stability of the power bus. The power bus may have a predefined acceptable voltage range for voltage variations of the power bus. The power bus may be used for providing a positive voltage to the first load that is coupled between the power bus and a return. A current is provided by the power bus to the first load and the current is returned from the first load through the return.

In some examples, the first load may be hot-plug inserted. The first load may be faulty. Thus, when inserted, the first load may draw considerable current from the power bus, may disturb the voltage stability of the power bus, and may induce a voltage variation beyond a predefined acceptable voltage range over the power bus. In some embodiments, the fuse includes a switch, e.g., a transistor switch. The power bus may be connected to the first load through the switch. The switch may have a control port, e.g., a gate of the transistor (MOSFET transistor), such that when a current through the switch exceeds a predefined current limit, the switch may open. In some embodiments, abruptly disrupting the switch current to prevent the voltage variation of the power bus beyond the predefined acceptable voltage range may in turn create a large inductive voltage spike on the power bus at a first node of the switch further from the first load.

In some embodiments, the fuse further includes an RC circuit having a resistor and a first capacitor in series between the power bus and the return. The RC circuit of the resistor and the first capacitor in series is coupled from one end to the first node of the switch and from the other end to the return. In some examples, the large inductive voltage spike is partially absorbed via the RC circuit to the return and at the same time the first capacitor is charged and a voltage of the first node of the switch is increased.

In some embodiments, the fuse further includes a transorb device, e.g., a Zener diode, that is coupled across the switch of the fuse between the first node of the switch and a second node of the switch closer to the first load. The transorb device may be connected such that when the voltage of the first node of the switch exceeds a breakdown voltage of the transorb device, the transorb device may begin conducting current from the first node of the switch to the second node of the switch through the transorb device, and the large inductive voltage spike is partially transferred to the second node of the switch.

In some embodiments, the fuse further includes a second capacitor between the power bus and the return. The second capacitor is coupled from one end to the second node of the switch and from the other end to the return. In some examples, the large inductive voltage spike is partially absorbed via the second capacitor to the return by partially absorbing the large inductive voltage spike through the RC circuit at the first node of the switch and partially transferring the large inductive voltage spike through the transorb device to the second node of the switch. Then by partially absorbing the large inductive voltage spike through the second circuit, the large inductive voltage spike may be controlled and may not exceed the voltage ratings of the power bus.

According to various aspects of the subject technology, an electronic fuse (e-fuse) for controlling input current of a load includes a transistor switch and a transorb device that is coupled in parallel to the transistor switch between a source and a drain of the transistor switch. A circuit that comprises the transistor switch and the transorb device in parallel, includes a first end and a second end. The first end of the circuit is coupled to a power bus and the second end of the circuit is coupled to a first node of the load.

According to various aspects of the subject technology, a power supply unit includes at least one power supply and an electronic fuse (e-fuse) for controlling an output current of the power supply unit. The e-fuse includes a transistor switch and a transorb device that is coupled in parallel to the transistor switch between a source and a drain of the transistor switch. A circuit that comprises the transistor switch and the transorb device in parallel, includes a first end and a second end. The first end of the circuit is coupled to a positive output node of the power supply and the second end of the circuit is coupled to a power bus to provide the output current at the power bus. The e-fuse further includes a first capacitor that is coupled between a return and the second end of the circuit. The first capacitor is coupled between the power bus and the return.

According to various aspects of the subject technology, a load unit includes at least one load comprising an input port having a first node and a second node and an electronic fuse (e-fuse) for controlling an input current of the load. The e-fuse includes a transistor switch and a transorb device that is coupled in parallel to the transistor switch between a source and a drain of the transistor switch. A circuit that comprises the transistor switch and the transorb device in parallel, includes a first end and a second end. The first end of the circuit is coupled to a power bus and the second end of the circuit is coupled to the first node of the load. The e-fuse also includes an RC circuit that comprises a resistor coupled in series with a first capacitor. The RC circuit is coupled to the first end of the circuit. The RC circuit is coupled between the power bus and a return. The return is coupled to the second node of the load.

Figure 1:
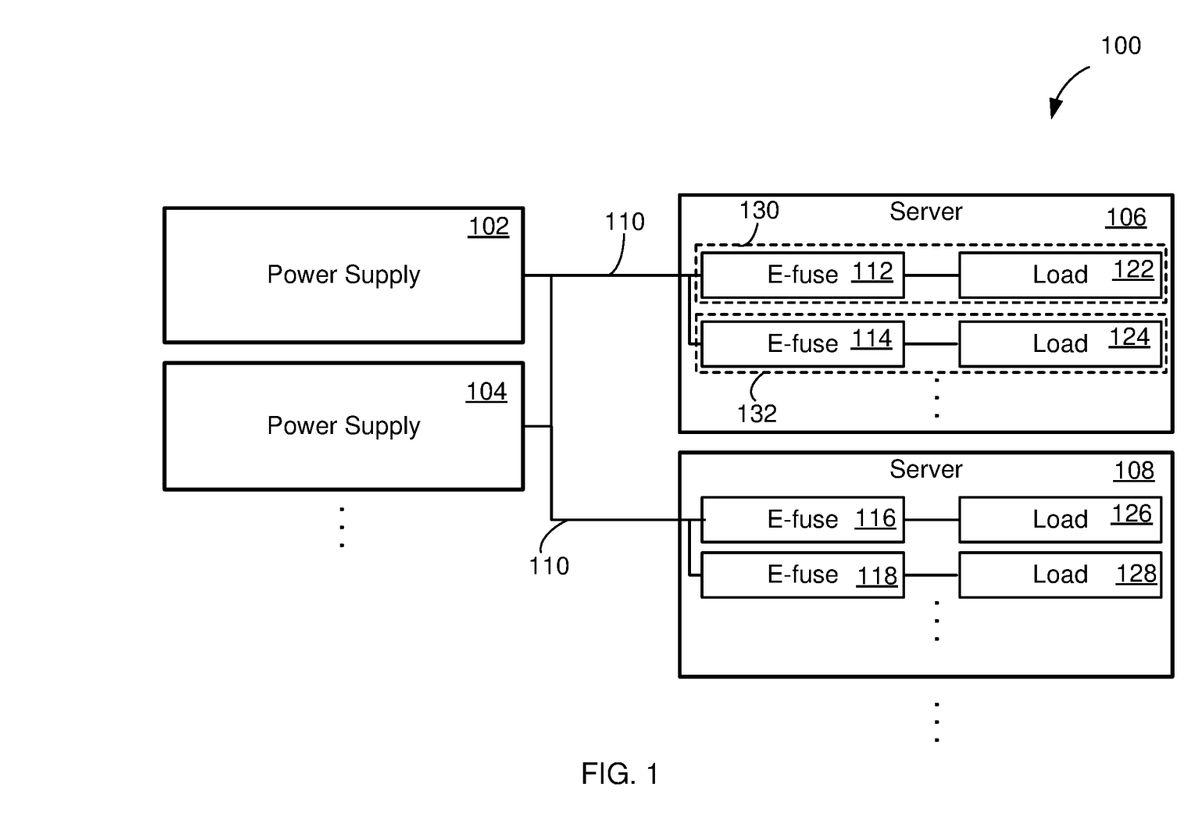
FIG. 1 illustrates a schematic diagram of an exemplary server system, according to some aspects of the disclosure.

FIG. 1 illustrates a schematic diagram of an exemplary server system 100, according to some aspects of the disclosure. Server system 100 of FIG. 1 may include one or more servers, e.g., two servers 106 and 108. Each one of the servers 106 or 108 may include one or more loads, e.g., devices or motherboards. In some examples, servers 106 includes loads 122 and 124 and server 108 includes loads 126 and 128. Server system 100 may further include one or more power supplies, e.g., two power supplies 102 and 104. The one or more power supplies 102 or 104 may be coupled to each other and may be coupled to power bus 110 to supply power to the one or more servers 106 and 108. In some examples, power supplies 102 and 104 are in parallel and are coupled to each other via power bus 110. Power supplies 102 and 104 may provide power to servers 106 and 108 via power bus 110. Each load of a server may be coupled through an e-fuse (electronic fuse) to power bus 110. In some examples, loads 122 and 124 of server 106 and loads 126 and 128 of server 108 are respectively connected via e-fuses 112 and 114 of server 106 and e-fuses 116 and 118 of server 108 to power bus 110 to receive power from power bus 110. E-fuses 112, 114, 116, and 118 are implemented to prevent a voltage variation of the power bus beyond a predefined acceptable voltage range. In some embodiments, e-fuses 112, 114, 116, and 118 are integrated at an input port of the loads 122, 124, 126, and 128 and are part of the loads to prevent the loads from inducing voltage variations beyond the predefined acceptable voltage range. E-fuses 112, 114, 116, and 118 are described in more details with respect to FIG. 3A and FIG. 3B. In some examples, the voltage of the power bus is 12.25 volts and the predefined acceptable range of the power bus 110 is between −850 and +350 millivolts around the 12.25 volts.

In some embodiments, an e-fuse and a load may be combined into a load unit. Server 106 of server system 100 shows two load units 130 and 132. Load unit 130 includes e-fuse 112 and load 122, and load unit 132 includes e-fuse 114 and load 124. As shown, the loads 122 and 124 are coupled to power bus 110 via respective e-fuses 112 and 114. The load unit is described with respect to FIG. 8.

Figure 2A:
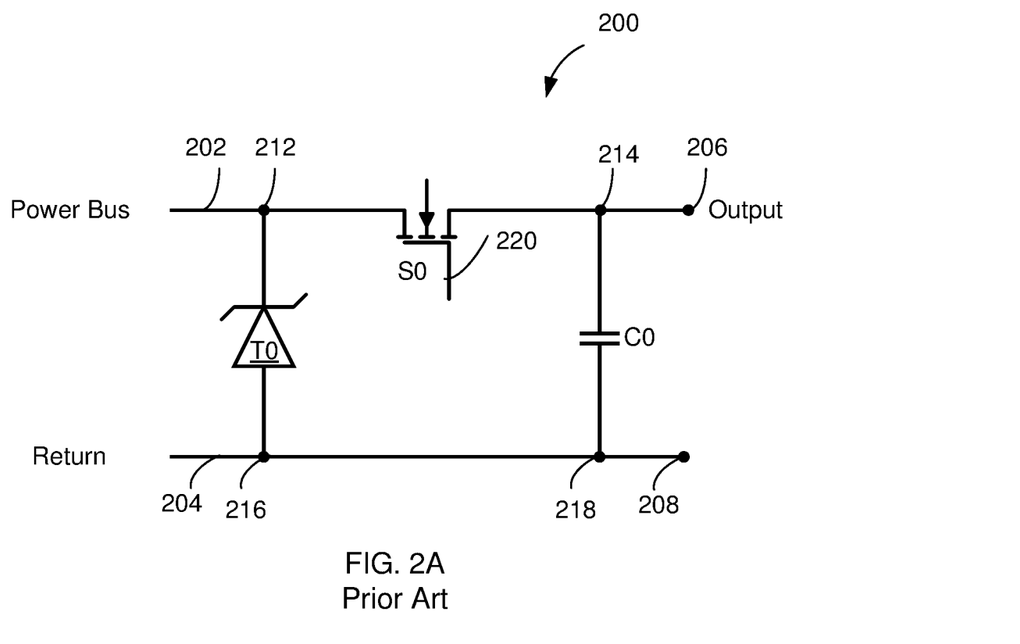
FIG. 2A illustrates a conventional e-fuse.

FIG. 2A illustrates a conventional e-fuse 200. In some examples, e-fuse 200 may be used as e-fuses 112, 114, 116, and 118 of FIG. 1. E-fuse 200 includes transorb device T0 that is coupled via node 212 to power bus 202 and via node 216 to return 204. In some examples, transorb device T0 is a Zener diode that is reverse biased from node 212 to node 216, and when a voltage from node 212 to node 216 exceeds a breakdown voltage of the Zener diode, transorb device T0 may start conducting current from node 212 to node 216. E-fuse 200 includes switch S0 that is coupled between nodes 212 and 214. E-fuse 200 also includes capacitor C0 that may be coupled between node 214 and node 218, where node 218 is the same return 204. As described, e-fuse 200 can be used as e-fuses 112, 114, 116, and 118 of FIG. 1 and thus e-fuse 200 can be coupled via output node 206 and return node 208 to one or more of the loads 122, 124, 126, and 128 of FIG. 1. In some embodiments, when switch S0 is conducting, a current may pass from node 212 of power bus 202, via switch S0 and via output node 206, to a load. The current may return from the load via return nodes 208, 218, and 216 of return 204. In some embodiments, when a load coupled between node 206 and 208 is faulty, a current through the switch S0 exceeds a predefined current limit, and switch S0 opens. In some embodiments, a current passing from node 206 to the load may be monitored by additional electronic circuits (not shown) to determine when switch S0 should be opened. In some embodiments, switch S0 is opened by sending a signal to control port 220, e.g., a gate, of switch S0.

Opening switch S0 may create a disturbance, e.g., a large inductive voltage spike at node 212. The voltage spike at node 212 may induce a large voltage from node 212 to node 216 that may exceed a breakdown voltage of the transorb device T0 (e.g., a Zener diode) and thus transorb device T0 may start conducting current from node 212 to node 216. In some examples, the voltage spike at node 212 may induce a current in transorb device T0 that exceeds a tolerable current limit of transorb device T0 such that the current may burn transorb device T0 to cause e-fuse 200 to become faulty. A faulty e-fuse 200 may not be used and should be replaced. Therefore, e-fuse 200 may need additional electronic circuits (not shown) to monitor transorb device T0 and to indicate when e-fuse 200 becomes faulty.

Figure 2B:
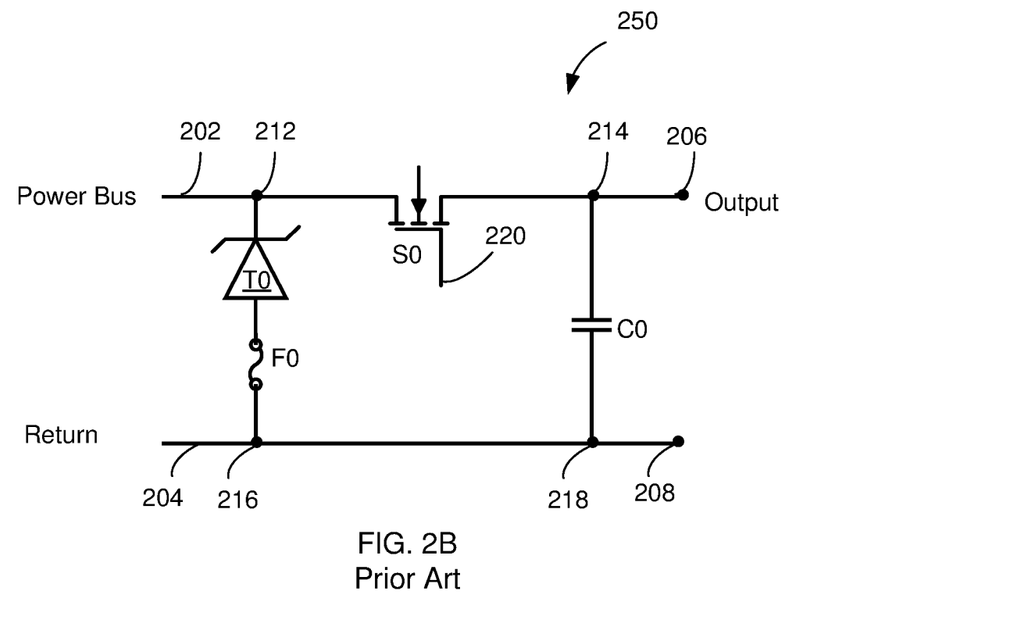
FIG. 2B illustrates a conventional e-fuse.

FIG. 2B illustrates a conventional e-fuse 250. In some examples, e-fuse 250 may be used as e-fuses 112, 114, 116, and 118 of FIG. 1. In some embodiments, e-fuse 250 includes the elements of e-fuse 200 with one additional element of an ordinary fuse F0 in series with transorb device T0. In some embodiments, ordinary fuse F0 has a tolerable current limit that is below the tolerable current limit of the transorb device T0. Thus, the induced current in transorb device T0 may burn ordinary fuse F0 before harming transorb device T0. Therefore, ordinary fuse F0 may save transorb device T0 from being burned. Nonetheless, ordinary fuse F0 is costly. If ordinary fuse F0 is burned, the e-fuse becomes faulty. A faulty e-fuse 250 may not be used and should be replaced. Therefore, e-fuse 250 may need additional electronic circuits (not shown) to monitor ordinary fuse F0 and to determine when e-fuse 250 becomes faulty. In some examples, transorb device T0 of e-fuse 200 or 250 of a load, e.g., loads 122, 124, 126, or 128 of FIG. 1, is selected to tolerate the large voltage spike at node 212. However, the transorb device T0 may be defective or may become defective, e.g., because of some defect when transorb device T0 was made or because of handling of the load, e.g., due to electrostatic discharge (ESD). Thus, the large voltage spike at node 212 or a current induced because of the large voltage spike at node 212 may damage a defective transorb device T0.

Figure 3A:
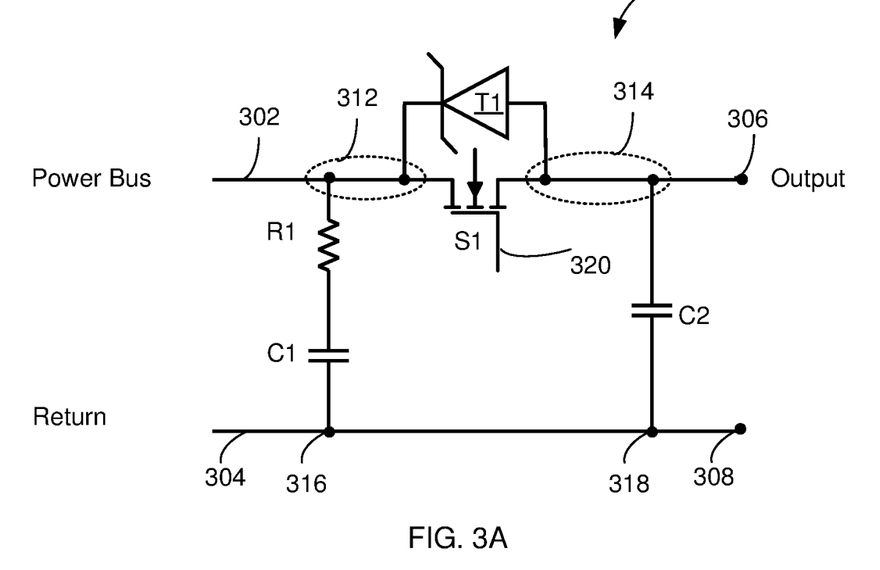
FIG. 3A illustrates a schematic diagram of an exemplary e-fuse, according to some aspects of the disclosure.

FIG. 3A illustrates a schematic diagram of an exemplary e-fuse 300, according to some aspects of the disclosure. In some examples, e-fuse 300 of FIG. 3A may be used as e-fuses 112, 114, 116, and 118 of FIG. 1. E-fuse 300 can be coupled via output node 306 and return node 308 to one or more of the loads 122, 124, 126, and 128 of FIG. 1. A current may be supplied through node 306 to the load, e.g., load 122, and the current may return from the load via node 308 to return 304. E-fuse 300 includes an RC circuit that includes resistor R1 and capacitor C1 in series that is coupled via node 312 to power bus 302 and via node 316 to return 304. E-fuse 300 includes switch S1 that is coupled between nodes 312 and 314 and also includes transorb device T1 that is coupled parallel to switch S0 between nodes 312 and 314. E-fuse 300 also includes capacitor C2 that may be coupled between node 314 and node 318, which is the same return 304. In some embodiments, return 304 is a ground.

As described, transorb device T1 may be a Zener diode that is reverse biased from node 312 to node 314, and when a voltage from node 312 to node 314 exceeds a breakdown voltage of the Zener diode, transorb device T1 may start conducting current from node 312 to node 314. In some examples, switch S1 conducts a current from node 312 to node 314 and thus transorb device T1, although it may be reverse biased, but does not perform in a breakdown voltage region and essentially no current may pass through transorb device T1. In some examples, switch S1 is opened by sending a signal to control port 320, e.g., a gate, of switch S1, and essentially no current may pass from node 312 to node 314 through switch S1. In some embodiments, when the load coupled between node 306 and 308 is faulty, a current through the switch S1 exceeds a predefined current limit, and the signal is sent to control port 320 to open switch S1. In some embodiments, a current passing from node 306 to the load may be monitored by additional electronic circuits (not shown) to determine when switch S1 should be opened.

In some embodiments, a power bus, e.g., power bus 302 of FIG. 3, may be coupled via node 306 of e-fuse 300 to a load, e.g., one of the loads 122, 124, 126, or 128 of FIG. 1. The e-fuse 300 may be coupled across the power bus 302 and the return 304 to provide power to a load, e.g., load 124. The e-fuse 302 may be used for controlling a current of load 124 and for controlling voltage stability of power bus 302. The load 124 may be coupled between the nodes 306 and 308 where node 306 may be coupled to the power bus 302 and node 308 may be coupled to the return 304. The power bus 302 may provide a positive voltage to load 124. The power bus 302 may also provide a current via node 306 to load 124 and the current may be returned via node 308 from load 124 to the return 304.

In some embodiments, one of the loads 122, 124, 126, or 128 is hot-plug inserted in one of the servers 106 or 108 of server system 100 of FIG. 1. The load 122, 124, 126, or 128 may respectively include e-fuses 112, 114, 116, or 118, which are consistent with e-fuse 300 of FIG. 3A. In some examples, when a load, e.g., load 124 is hot-plug inserted into server 106, switch S1 of the respective e-fuse 114 is open and may stay open. After the insertion, switch S1 of e-fuse 114 may close and allow a soft-start for a current to load 124. In some examples, load 124 may be faulty. Thus, the current to load 124, which is faulty, may exceed a predefined current limit of the power bus 302 and switch S1 may subsequently open. Opening switch S1 of e-fuse 114 may induce a disturbance, a voltage spike, over the power bus 302. Switch S1 may have a control port, control port 320, such that when a current through the switch S1 exceeds the predefined current limit, switch S1 may open. In some embodiments, opening switch S1 to disrupt the current through switch S1, may be used to prevent load 124, which is faulty, to be powered by power bus 302. However, opening switch S1 may in turn create a large inductive voltage spike on the power bus 302 at node 312. In some embodiments, the large inductive voltage spike is partially absorbed via the resistor R1 and capacitor C1 in series and via node 316 to return 304. In some embodiments, the discharging of the large inductive voltage spike of node 312 by the resistor R1 and capacitor C1 may charge capacitor C1, and thus the voltage of node 312 may further increase. In some examples, when e-fuse 300 is not present and load 124, which is faulty, is directly coupled between power bus 302 and return 304, the inrush current to load 124 may adversely affect the voltage stability of the power bus 302 and may cause neighboring loads to shut down.

In some embodiments, increasing the voltage of node 312 may further reverse bias transorb device T1 to a point that transorb device T1 may enter a breakdown voltage region and start conducting current from node 312 to node 314. Thus, the large inductive voltage spike may be partially transferred from node 312 to node 314. In some embodiments, after transferring the large inductive voltage spike to node 314, the inductive voltage spike is partially transferred to return 304 via capacitor C2 and node 318. Thus, the large inductive voltage spike is partially absorbed through the series resistor R1 and capacitor C1 between nodes 312 and 316, and partially transferred through the transorb device T1 to the node 314. Then, the large inductive voltage spike is partially absorbed through capacitor C2 and therefor the large inductive voltage spike may be controlled and may not exceed the voltage ratings of power bus 302.

Figure 3B:
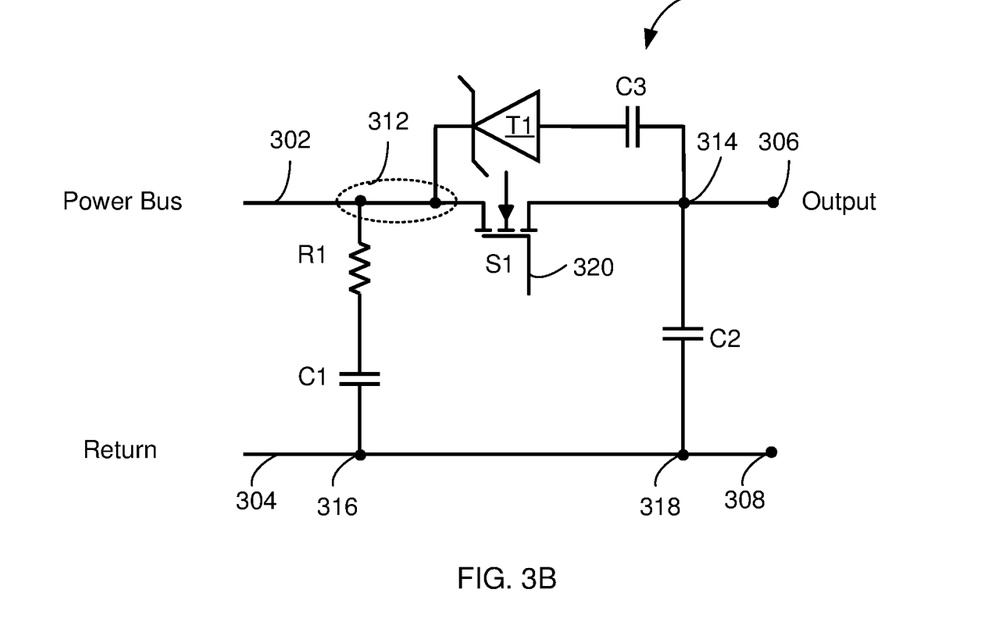
FIG. 3B illustrates a schematic diagram of an exemplary e-fuse, according to some aspects of the disclosure.

FIG. 3B illustrates a schematic diagram of an exemplary e-fuse 350, according to some aspects of the disclosure. In some embodiments, e-fuse 350 of FIG. 3B includes the components of e-fuse 300 of FIG. 3A and additionally includes third capacitor C3 in series with transorb device T1. In some embodiments, e-fuse 350 may be used as e-fuses 112, 114, 116, and 118 of FIG. 1 and can be coupled via output node 306 and return node 308 to one or more of the loads 122, 124, 126, and 128 of FIG. 1. Having capacitor C3 in series with transorb device T1, may allow using a lower voltage rated transorb device. In some embodiments, capacitor C3 reduces a leakage current across switch S1. In some embodiments, transorb device T1 with lower voltage rating may lower the inductive voltage spike. In some examples, as current passes through transorb device T1, capacitor C3 gets charged and partially absorbs the inductive voltage spike. At the same time, charging capacitor C3 may limit an amount of current passing through transorb device T1.

In some examples, resistor R1 is selected between 5 and 40 ohms, e.g., 10 ohms, and first capacitor C1, second capacitor C2, and third capacitor C3 are selected between 1 and 10 micro farads, e.g., 7 micro farad.

Figure 4A:
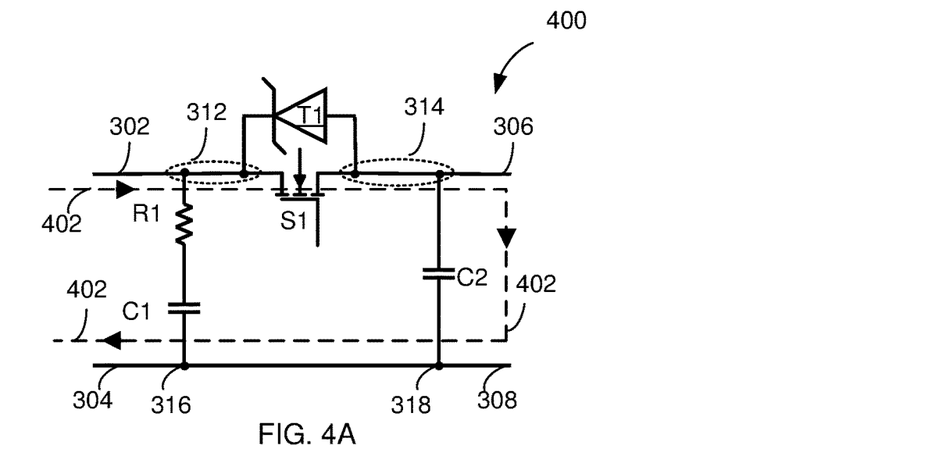
FIG. 4A illustrates a schematic diagram of an exemplary e-fuse showing direction of current through the e-fuse, according to some aspects of the disclosure.
Figure 4B:
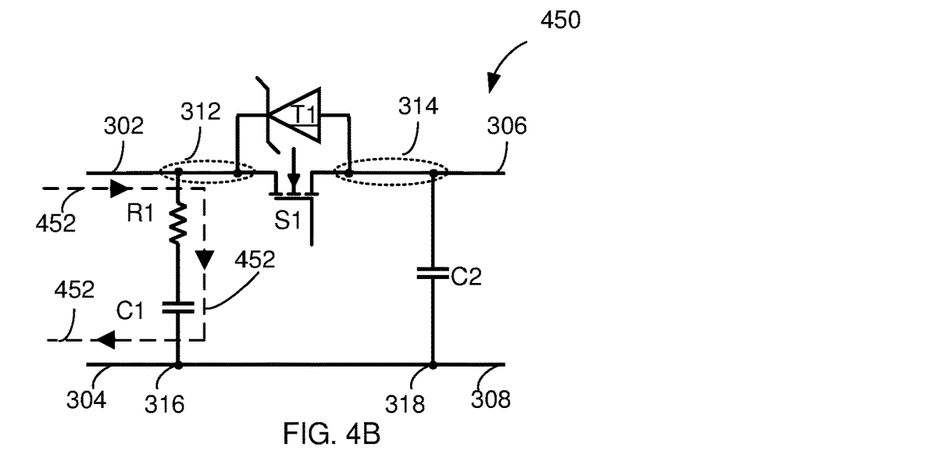
FIG. 4B illustrates a schematic diagram of an exemplary e-fuse showing direction of current through the e-fuse, according to some aspects of the disclosure.
Figure 4C:
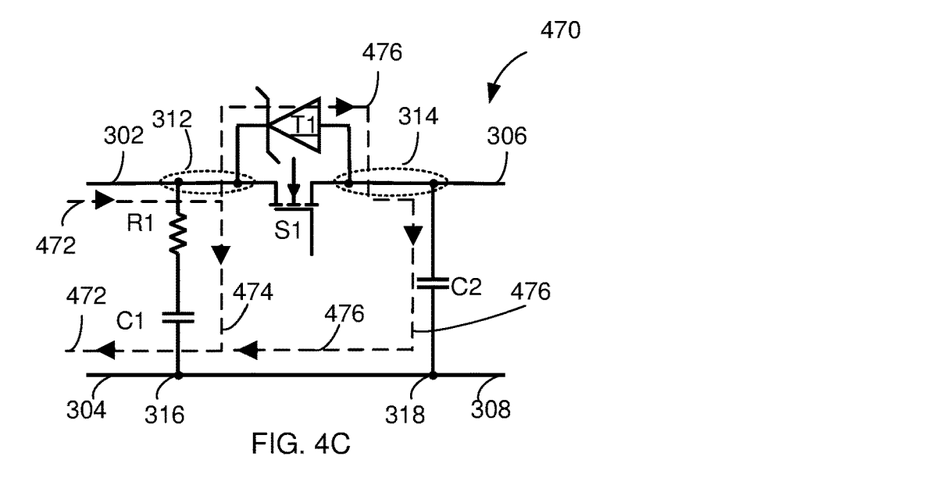
FIG. 4C illustrates a schematic diagram of an exemplary e-fuse showing direction of current through the e-fuse, according to some aspects of the disclosure.

FIGS. 4A-C illustrates schematic diagrams 400, 450, and 470 showing exemplary operating states of the example e-fuse 300. Specifically, the diagrams 400, 450, and 470 show how current flows through the e-fuse 300 during various operating states, according to some aspects of the disclosure. Diagram 400 of FIG. 4A illustrates a state in which the switch S1 is closed. Diagram 450 of FIG. 4B illustrates a state immediately after the switch S1 has opened responsive to a fault event. Diagram 470 of FIG. 4C illustrates a state subsequent to the state shown in Diagram 450, in which the breakdown voltage of the transorb device T1 has been exceeded.

As noted above, in the state illustrated in diagram 400 of FIG. 4A the switch S1 is closed, for example because a fault event has not occurred (or has not yet been detected). Therefore current 402 coming from power bus 302 passes through switch S1, going through a load (not shown) that is coupled to nodes 306 and 308, and comes out from node 308 to return 304. In some examples, current 402 may create a first half of an inductive current loop from power bus 302 to e-fuse 400, from e-fuse 400 to a load (not shown), from the load back to the e-fuse 400, and from e-fuse 400 to return 304. The second half of the inductive current loop may be closed by power bus 302 and return 304 connecting to a power supply, e.g., power supply 102 of FIG. 1. The state illustrated in diagram 400 may occur, for example, when a load that is not faulty is hot-plug inserted and then switch S1 of e-fuse 300 closes. Even when a faulty load is hot-plug inserted and then switch S1 of e-fuse 300 closes, the flow of current 402 illustrated in diagram 400 may still be maintained for a very short amount of time until it is realized that the amount of current 402 exceeds a predefined current limit and a signal is sent to control port 320 to open switch S1 Immediately after the switch S1 is opened, in response to the current exceeding the limit, the state illustrated in diagram 450 of FIG. 4B occurs. The opening of the switch S1 causes the current to cease flowing through the switch S1, which is cutting current 402 of the inductive current loop. Cutting current 402 at node 312, is cutting a current of an inductor and thus may result in conditions that would tend to create a large inductive voltage spike at node 312 that requires countermeasures to be absorbed.

In some embodiments, when the switch S1 of e-fuse 300 has just been opened as shown in Diagram 450, the voltage at node 312 has not yet risen and thus the transorb device T1 is not yet conducting in the breakdown voltage region. Thus current 452 coming from power bus 302 passes through the resistor R1 and capacitor C1 in series, and comes out from node 316 to return 304. The current 452 flowing into the capacitor C1 increases the voltage of the node 312, and the state illustrated in diagram 450 may last until the voltage of node 312 is increased to a point that transorb device T1 begins conducting in the breakdown voltage region. As shown in diagram 450, in this state no current passes through switch S1 and transorb device T1 and no current may reach the load coupled between nodes 306 and 308. By passing current 452 from node 312 to return 304, the large inductive voltage spike that would otherwise occur as a result of the opening of the switch S1 is partially absorbed and passed to return 304.

When the voltage of the node 312 reaches a level at which the transorb device T1 starts to conduct, the state illustrated in diagram 470 of FIG. 4C occurs. In the state illustrated in diagram 470, switch S1 of e-fuse 300 is opened, and also transorb device T1 is conducting in the breakdown voltage region. Diagram 470 also shows current 472 coming from power bus 302 and being divided into a current 474 and 476. Current 474 may pass through the resistor R1 and capacitor C1 in series, and may come out from node 316 to go to return 304. Current 476 may pass through transorb device T1, going through capacitor C2, and coming out from node 318 to go to return 304. By passing current 474 from node 312 to return 304, and also by passing current 476 through transorb device T1 and capacitor C2 to return 304, the large inductive voltage spike is partially absorbed by current 474. The large inductive voltage spike is also partially absorbed by current 476 that is passed to return 304. In some examples, current 476 that goes through transorb device T1, may partially go through capacitor C2 to return 304 and may partially go via the faulty load to return 304.

Figure 5:
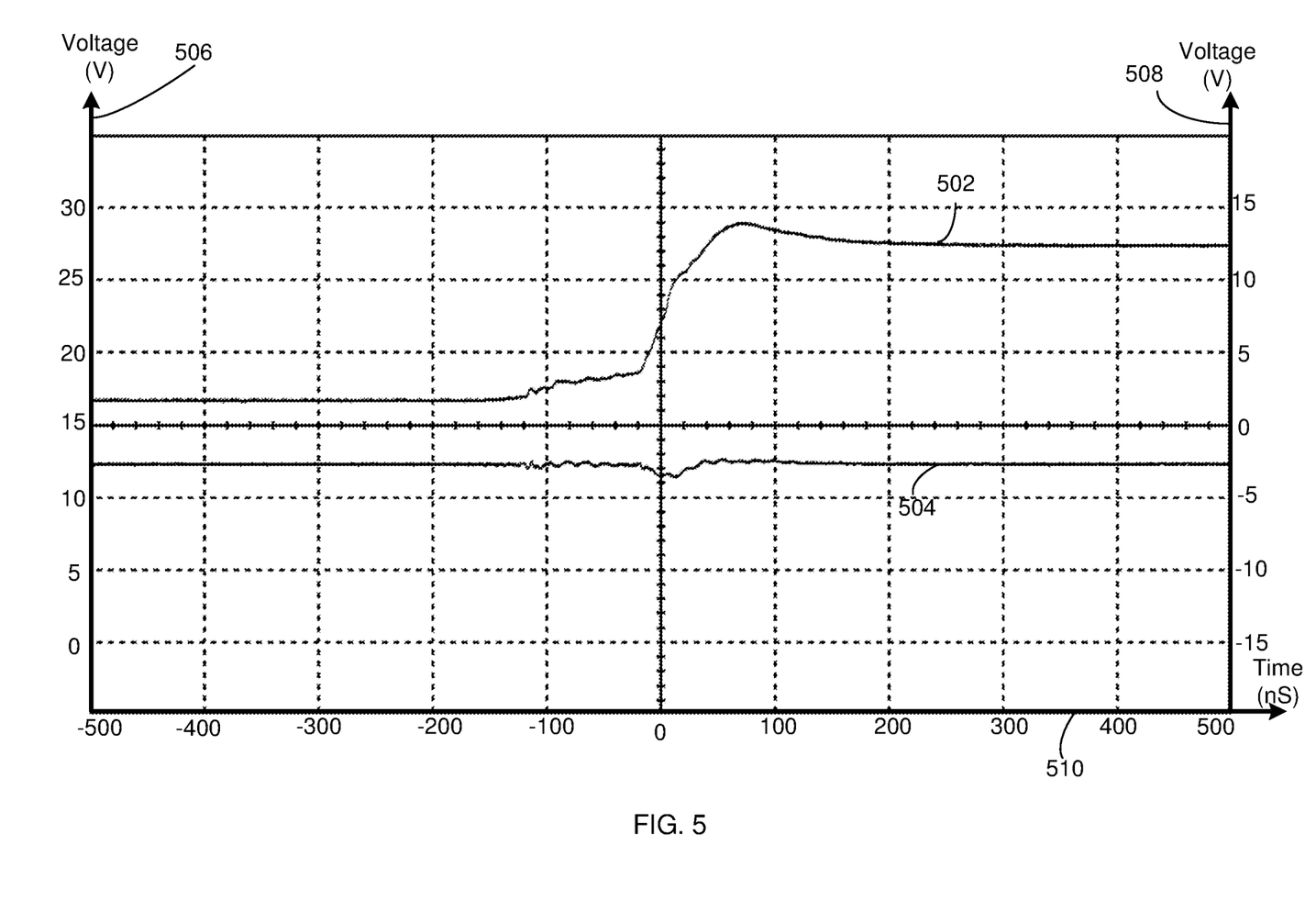
FIG. 5 illustrates graphs of exemplary voltage variations of the e-fuse of FIG. 3A, according to some aspects of the disclosure.

FIG. 5 illustrates graphs 502 and 504 of exemplary voltage variations of the e-fuse 300 of FIG. 3A, according to some aspects of the disclosure. FIG. 5 includes graphs 502 and 504, that are voltage variations in time when a load is hot-plug inserted between the power bus 302 and return 304 and switch S1 is subsequently closed. In some examples as shown in FIG. 5, the load is not faulty and closing switch S1 after hot-plug insertion does not induce a fault condition. Graph 502 shows voltage variations in time of a voltage between node 312 and return 304 of FIG. 3A that is displayed based on coordinate 510 for time and coordinate 508 for voltage. Graph 504 shows voltage variations in time of a voltage between node 314 and return 304 of FIG. 3A that is displayed based on coordinate 510 for time and coordinate 506 for voltage. As shown, each unit of coordinate 510 is 100 Nano seconds and each unit of coordinates 506 and 508 is 5 volts. In some examples, there is no fault condition, switch S1, which is open during hot-plug insertion, closes after the load is hot-plug inserted and switch S1 stays closed and transorb device T1 does not go to a breakdown voltage region. As shown, the voltage of node 312 in graph 502 starts increasing from 2 volts at the time of closing switch S1 at about −150 Nano seconds subsequent to the hot-plug insertion. The voltage of node 312 in graph 502 increases to about 12 volts at about +150 Nano seconds. In some examples, the voltage of node 314 in graph 504 starts with a nominal voltage of 12.25 volts. At about −150 Nano seconds after closing switch S1, the voltage of node 314 starts a small dip to 12 volts, which happens around time zero. The voltage of node 314 comes back to 12.25 volts at about +150 Nano seconds.

Figure 6:
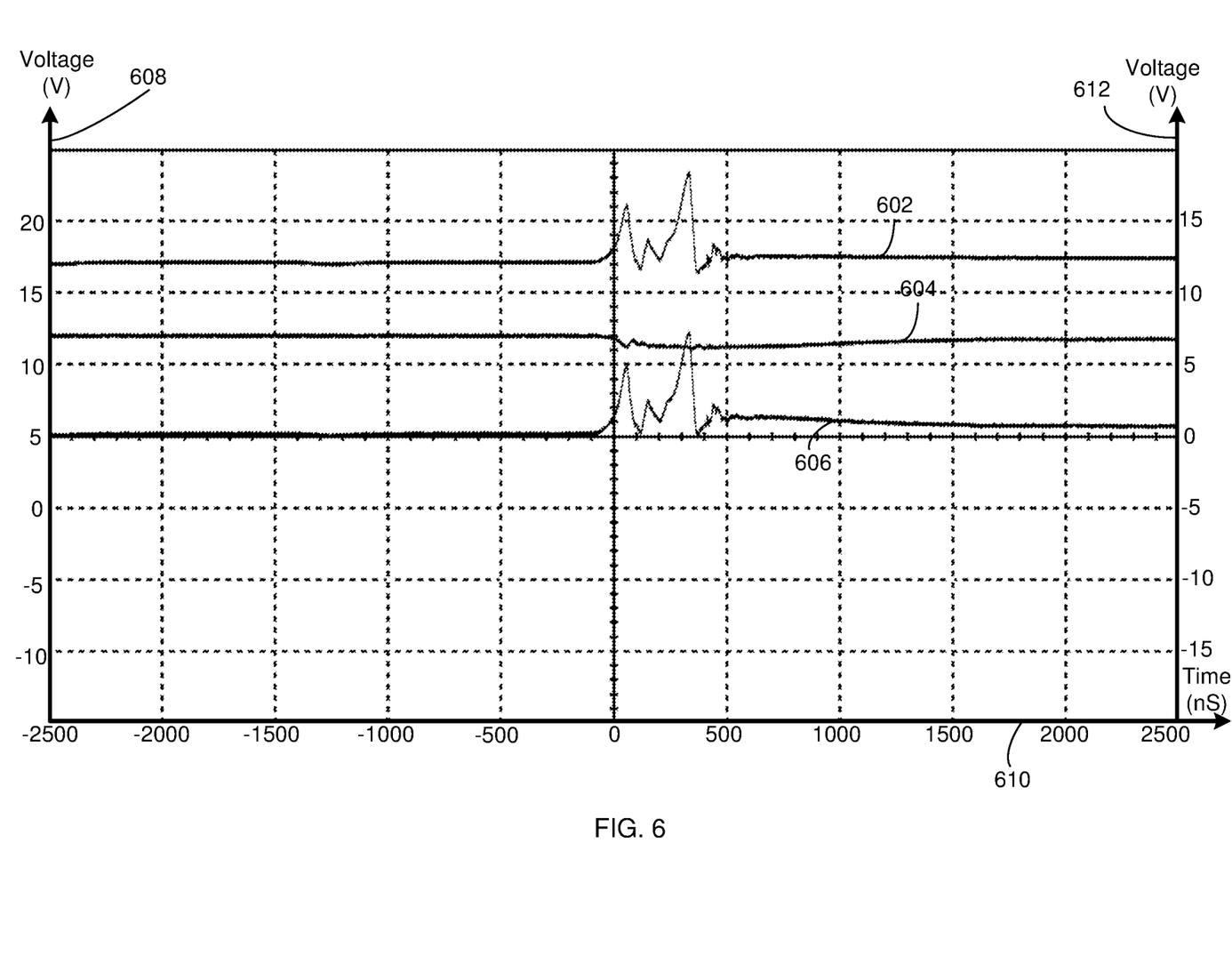
FIG. 6 illustrates graphs of exemplary voltage variations of the e-fuse of FIG. 3A, according to some aspects of the disclosure.

FIG. 6 illustrates graphs 602, 604, and 606, of exemplary voltage variations of the e-fuse of FIG. 3A, according to some aspects of the disclosure. FIG. 6 includes graphs 602, 604, and 606, that are voltage variations in time when switch S1 of an e-fuse, e.g., e-fuse 112 of FIG. 1, opens when a current to a load, e.g., load 122 of FIG. 1, exceeds a predefined current limit. In some examples, the load 122 that is hot-plug inserted is faulty and after switch S1 closes, the current to load 122 exceeds the predefined current limit. In some examples, load 122 is already coupled to power bus 110 and a fault condition occurs in load 122 such that the current to load 122 exceeds the predefined current limit. Graph 602 shows voltage variations in time of a voltage between node 312 and return 304 of FIG. 3A that is displayed based on coordinate 610 for time and coordinate 612 for voltage. Graph 604 shows voltage variations in time of a voltage between node 314 and return 304 of FIG. 3A that is displayed based on coordinate 610 for time and coordinate 608 for voltage. Additionally, graph 606 shows voltage variations in time of a voltage between nodes 312 and 314 of FIG. 3A that is displayed based on coordinate 610 for time and coordinate 612 for voltage. As shown, each unit of coordinate 610 is 500 Nano seconds and each unit of coordinates 608 and 612 is 5 volts.

In some examples, because there is a fault condition and the current to load 122 exceeds the predefined current limit, switch S1 opens at about −150 Nano seconds. Transorb device T1 may go to a breakdown voltage region and conduct. As shown, the voltage of node 312 (graph 602) may show a disturbance between −150 and +500 Nano seconds. In some examples, the voltage stress across switch S1 (graph 606) peaks at 17.24 volts that may be below the 20 volt voltage rating of switch S1. The voltage of node 314 (graph 604) starts with a nominal voltage of 12.25 volts and makes a small dip to 12 volts between the time switch S1 opens at −150 Nano seconds and a time the induced voltage spike being absorbed at about +500 Nano seconds. The voltage of node 314 (graph 604) may gradually increase back to the nominal voltage of 12.25 volts at about +500 Nano seconds.

In some embodiments, by partially absorbing the inductive voltage spike through current 474 of FIG. 4C, a current in transorb device T1 may be limited and may not pass the current rating of the transorb device T1. As described with respect to FIG. 2A and FIG. 2B, the large voltage spike at node 212 or a current induced in transorb device T0 because of the large voltage spike at node 212, may damage transorb device T0. In some embodiments, the voltage spike at node 212 of FIG. 2A or FIG. 2B is larger than the voltage spike at node 312 of FIG. 3 because by opening switch S0 a current reaching node 212 of e-fuse 200 or 250 virtually drops to zero. However, by opening switch S1 of e-fuse 300, a portion of the current reaching node 312 of e-fuse 300 may still pass through RC circuit and thus the current reaching node 312 does not drop to zero. When using e-fuse 300 or e-fuse 350, by opening switch S1, current 402 of FIG. 4A may not drop to zero and thus voltage variation 606 across transorb device T1 between nodes 312 and 314 (between −150 and +500 Nano seconds) may be smaller than the voltage variation across transorb device T0 between nodes 212 and 216, even when a same current passes through switches S0 and S1 when switches S0 and S1 open.

Figure 7:
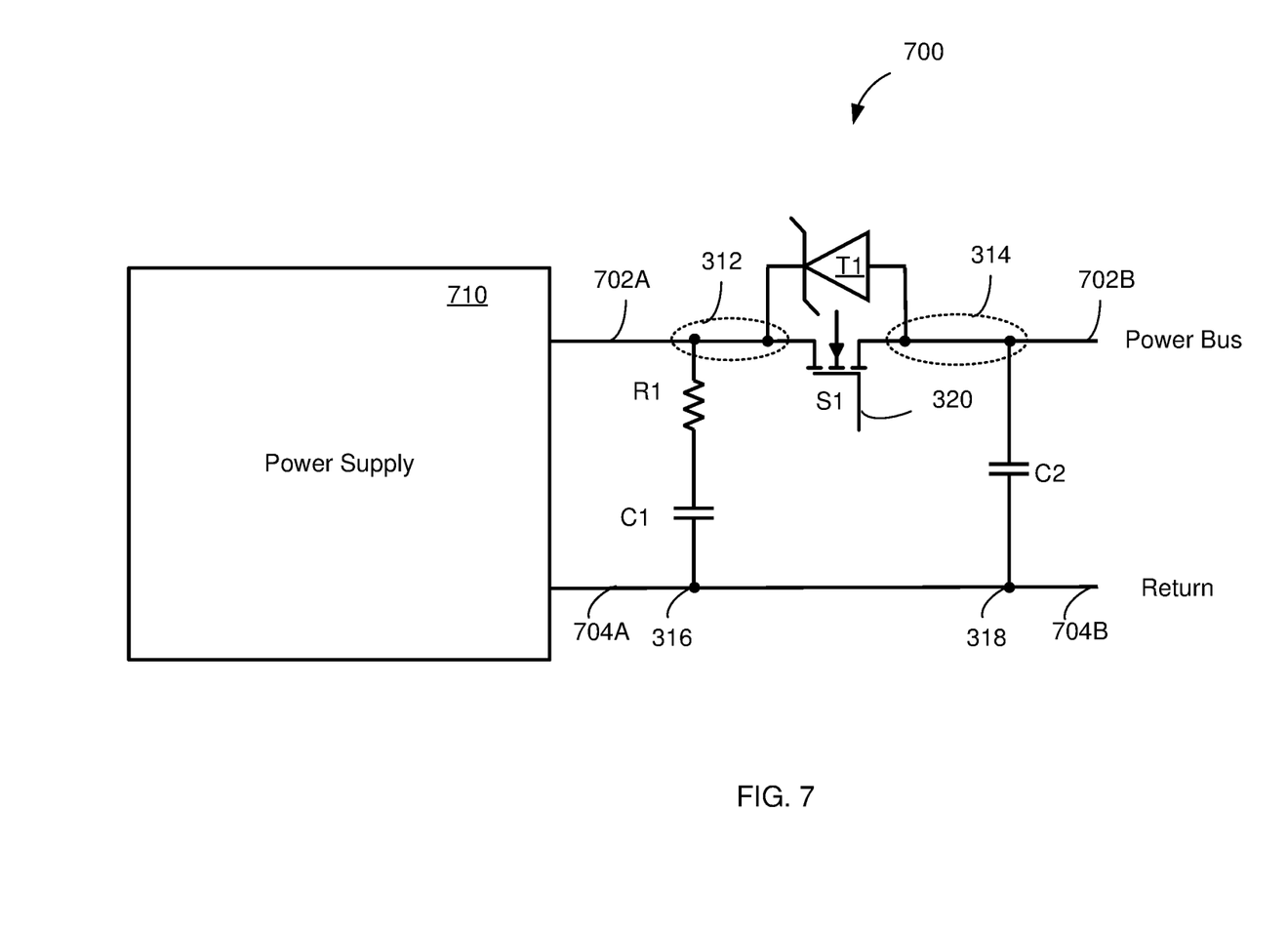
FIG. 7 illustrates a schematic diagram of an exemplary power supply unit having a power supply coupled to an e-fuse, according to some aspects of the disclosure.

FIG. 7 illustrates a schematic diagram of an exemplary power supply unit 700 having a power supply coupled to an e-fuse, according to some aspects of the disclosure. Power supply unit 700 of FIG. 7 includes power supply 710 and an e-fuse, e.g., e-fuse 300 of FIG. 3A. Power supply 700 has positive output 702A and return 704A that are coupled to e-fuse 300. An output of e-fuse 300 may provide power bus 702B and return 704B, where return 704B is the same as return 704A. One or more loads, e.g., load 126 of loads 122, 124, 126, and 128 of FIG. 1, may be hot-plug inserted across power bus 702B and return 704B. Subsequent to hot-plug insertion when switch S1 closes, e-fuse 300 may prevent a damage to power supply 710 when load 126 is faulty. In some examples, server system 100 of FIG. 1 includes one or more power supply units 700 instead of power supplies 102 and 104 and power bus 110 may connect to node 314 of the e-fuse 300.

Figure 8:
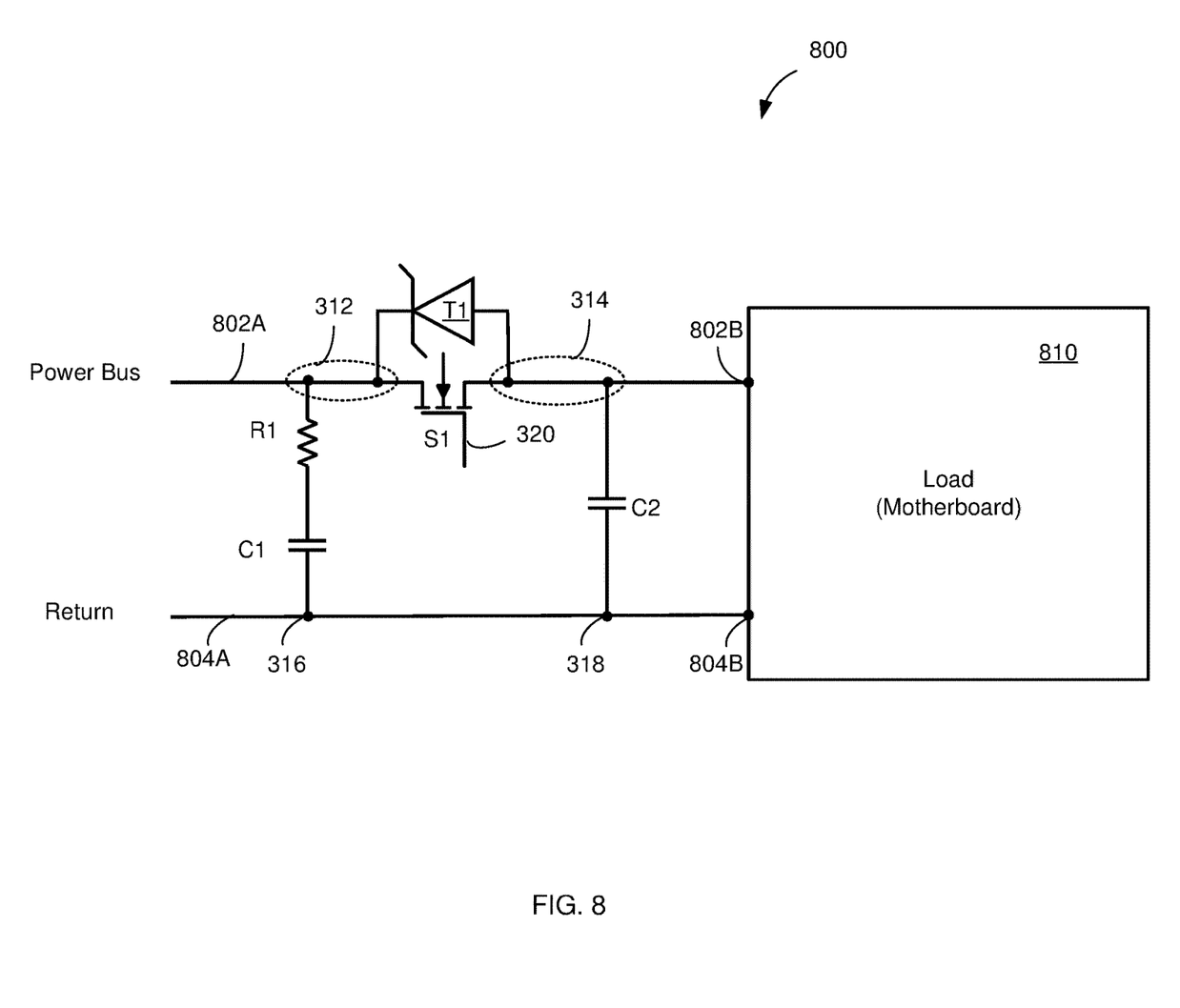
FIG. 8 illustrates a schematic diagram of an exemplary load unit having an e-fuse coupled to a load, according to some aspects of the disclosure.

FIG. 8 illustrates a schematic diagram of an exemplary load unit 800 having an e-fuse coupled to a load, according to some aspects of the disclosure. Load unit 800 of FIG. 8 includes load 810 (a motherboard) and an e-fuse, e.g., e-fuse 300 of FIG. 3A that are coupled through nodes 802B and 804B of the load 810. Load 810 is consistent with loads 122, 124, 126, and 128 of FIG. 1. Load unit 800 may be hot-plug inserted across power bus 802A and return 804A. Subsequent to hot-plug insertion when switch S1 of e-fuse 300 closes, if the motherboard 810 is faulty, e-fuse 300 may prevent the current drawn by the faulty motherboard 810 from adversely affecting the voltage stability of power bus 802A. In some examples, load 810 is a processor, a motherboard, a computer system, or the like.

As described, e-fuse 300 may partially return the voltage spike at node 312 via the series resistor R1 and capacitor C1 to return 304. The voltage spike at node 312 is also partially transferred across transorb device T1 to node 314. Thus, the voltage spike may partially be absorbed by a load, e.g., one of loads 122, 124, 126, and 128 of FIG. 1, even if faulty, that is coupled to nodes 306 and 308 of e-fuse 300. Thus, the voltage spike at node 312 may be suppressed.

The present disclosure is provided to enable any person skilled in the art to practice the various aspects described herein. The disclosure provides various examples of the subject technology, and the subject technology is not limited to these examples. Various modifications to these aspects will be readily apparent to those skilled in the art, and the generic principles defined herein may be applied to other aspects.

A reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The word "exemplary" is used herein to mean "serving as an example or illustration." Any aspect or design described herein as "exemplary" is not necessarily to be construed as preferred or advantageous over other aspects or designs. In one aspect, various alternative configurations and operations described herein may be considered to be at least equivalent.

As used herein, the phrase "at least one of" preceding a series of items, with the term "or" to separate any of the items, modifies the list as a whole, rather than each item of the list. The phrase "at least one of" does not require selection of at least one item; rather, the phrase allows a meaning that includes at least one of any one of the items, and/or at least one of any combination of the items, and/or at least one of each of the items. By way of example, the phrase "at least one of A, B, or C" may refer to: only A, only B, or only C; or any combination of A, B, and C.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an embodiment may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a configuration may refer to one or more configurations and vice versa.

In one aspect, unless otherwise stated, all measurements, values, ratings, positions, magnitudes, sizes, and other specifications that are set forth in this specification, including in the claims that follow, are approximate, not exact. In one aspect, they are intended to have a reasonable range that is consistent with the functions to which they relate and with what is customary in the art to which they pertain.

It is understood that the specific order or hierarchy of steps, operations, or processes disclosed is an illustration of exemplary approaches. Based upon design preferences, it is understood that the specific order or hierarchy of steps, operations, or processes may be rearranged. Some of the steps, operations, or processes may be performed simultaneously. Some or all of the steps, operations, or processes may be performed automatically, without the intervention of a user. The accompanying method claims, if any, present elements of the various steps, operations, or processes in a sample order, and are not meant to be limited to the specific order or hierarchy presented.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112 (f) unless the element is expressly recited using the phrase "module for" or, in the case of a method claim, the element is recited using the phrase "step for." Furthermore, to the extent that the term "include," "have," or the like is used, such term is intended to be inclusive in a manner similar to the term "comprise" as "comprise" is interpreted when employed as a transitional word in a claim.

What is claimed is:

1. An electronic fuse (e-fuse) for controlling input current of a load, comprising:
   a transistor switch, wherein the transistor switch is a MOSFET that includes a gate node, and the gate node of the transistor switch is configured to receive a signal to turn the transistor switch on or off based on a current at a first node of the load;
   a transorb device coupled in parallel to the transistor switch between a source and a drain of the transistor switch, wherein a circuit comprising the transistor switch and the transorb device in parallel comprises a first end and a second end, wherein the first end of the circuit is configured to be coupled to a power bus and the second end of the circuit is configured to be coupled to the first node of the load; and
   an RC circuit comprising a resistor coupled in series with a first capacitor, wherein the RC circuit is coupled to the first end of the circuit, wherein the RC circuit is configured to be coupled between the power bus and a return, wherein the return is configured to be coupled to a second node of the load.

2. The e-fuse of claim 1, further comprising: a second capacitor coupled between the return and the second end of the circuit, wherein the second capacitor is configured to be coupled across an input port of the load that comprises the first and second nodes of the load.

3. The e-fuse of claim 1, comprising a second capacitor coupled in series with the transorb device, wherein the second capacitor reduces a leakage current across the transistor switch.

4. The e-fuse of claim 2, comprising a third capacitor coupled in series with the transorb device, wherein the third capacitor reduces a leakage current across the transistor switch.

5. The e-fuse of claim 1, wherein the transorb device comprises a Zener diode that is configured to be reverse biased.

6. The e-fuse of claim 1, wherein the gate node is configured to receive a signal to turn the transistor switch off when the current at the first node of the load is above a predefined current limit.

7. The e-fuse of claim 6, wherein when a faulty second load is coupled between the second end of the circuit and a return, the current at the first node of the load is configured to go above the predefined current limit and the transistor switch is configured to turn off, a voltage at the first end of the circuit is configured to increase and put the transorb device in a breakdown voltage region to conduct from the first end to the second end of the circuit.

8. The e-fuse of claim 1, wherein when a non-faulty first load is coupled between the second end of the circuit and a return, the transistor switch is configured to turn on and a current pass from the power bus through the transistor switch to the first node of the first load.

9. A power supply unit comprising:
   at least one power supply;
   an electronic fuse (e-fuse) controlling an output current of the power supply unit comprising:
   a transistor switch, wherein the transistor switch is a MOSFET that includes a gate node, and the gate node of the transistor switch is configured to receive a signal to turn the transistor switch on or off based on a current at a power bus;
   a transorb device coupled in parallel to the transistor switch between a source and a drain of the transistor switch, wherein a circuit comprising the transistor switch and the transorb device in parallel comprises a first end and a second end, wherein the first end of the circuit is configured to be coupled to the positive output node of the power supply and the second end of the circuit is configured to be coupled to the power bus to provide the output current at the power bus;
a first capacitor coupled between a return and the second end of the circuit, wherein the first capacitor is configured to be coupled between the power bus and the return; and
an RC circuit comprising a resistor coupled in series with a second capacitor, wherein the RC circuit is coupled to the first end of the circuit, wherein the RC circuit is configured to be coupled between the positive output node of the power supply and the return, wherein the return is configured to be coupled to a return node of the power supply.

10. The power supply unit of claim 9, wherein the e-fuse comprises a third capacitor coupled in series with the transorb device, wherein the third capacitor reduces a leakage current across the transistor switch.

11. The power supply unit of claim 9, wherein the transorb device of the e-fuse comprises a Zener diode that is configured to be reverse biased.

12. The power supply unit of claim 9, wherein the gate node is configured to receive a signal to turn the transistor switch off when the current at the power bus is above a predefined current limit.

13. The power supply unit of claim 12, wherein one or more loads are configured to be coupled between the power bus and the return.

14. A load unit comprising:
at least one load comprising an input port having a first node and a second node;
an electronic fuse (e-fuse) controlling an input current of the load comprising:
a transistor switch, wherein the transistor switch of the e-fuse is a MOSFET that comprises a gate node, wherein the gate node is configured to receive a signal to turn the transistor switch on or off based on a current at the first node of the load;
a transorb device coupled in parallel to the transistor switch between a source and a drain of the transistor switch, wherein a circuit comprising the transistor switch and the transorb device in parallel comprises a first end and a second end, wherein the first end of the circuit is configured to be coupled to a power bus and the second end of the circuit is configured to be coupled to the first node of the load; and
an RC circuit comprising a resistor coupled in series with a first capacitor, wherein the RC circuit is coupled to the first end of the circuit, wherein the RC circuit is configured to be coupled between the power bus and a return, wherein the return is configured to be coupled to the second node of the load.

15. The load unit of claim 14, wherein the e-fuse comprises a second capacitor coupled in series with the transorb device, wherein the second capacitor reduces a leakage current across the transistor switch.

16. The load unit of claim 14, wherein the e-fuse further comprises:
a second capacitor coupled between the return and the second end of the circuit, wherein the second capacitor is configured to be coupled across the input port of the load.

17. The load unit of claim 16, wherein the e-fuse comprises a third capacitor coupled in series with the transorb device, wherein the third capacitor reduces a leakage current across the transistor switch.

18. The load unit of claim 14, wherein one or more power supplies are configured to be coupled across the RC circuit between the power bus and the return.

19. The load unit of claim 14, wherein the transorb device of the e-fuse comprises a Zener diode that is configured to be reverse biased.

20. The load unit of claim 14, wherein the gate node is configured to receive a signal to turn the transistor switch off when the current at the load is above a predefined current limit.

* * * * *